(12) United States Patent
Emura et al.

(10) Patent No.: US 8,592,954 B2
(45) Date of Patent: Nov. 26, 2013

(54) SEMICONDUCTOR ELEMENT AND METHOD OF MANUFACTURING THE SEMICONDUCTOR ELEMENT

(75) Inventors: Keiji Emura, Anan (JP); Fumihiro Inoue, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/171,303

(22) Filed: Jun. 28, 2011

(65) Prior Publication Data

US 2011/0316126 A1     Dec. 29, 2011

(30) Foreign Application Priority Data

Jun. 29, 2010   (JP) ................................ 2010-147133

(51) Int. Cl.
   *H01L 29/02*     (2006.01)
(52) U.S. Cl.
   USPC ............ 257/632; 257/E29.002; 257/E21.158; 438/597
(58) Field of Classification Search
   USPC ........................................................ 257/632
   See application file for complete search history.

(56) References Cited

U.S. PATENT DOCUMENTS

| | | | |
|---|---|---|---|
| 7,141,825 B2* | 11/2006 | Horio et al. ...................... 257/79 |
| 7,259,110 B2* | 8/2007 | Ohnuma et al. .............. 438/782 |
| 7,323,724 B2* | 1/2008 | Sugimoto et al. ............... 257/99 |
| 7,348,593 B2* | 3/2008 | Koo et al. ........................ 257/40 |
| 8,203,152 B2* | 6/2012 | Hanaoka et al. ................ 257/79 |
| 8,299,529 B2* | 10/2012 | Takasawa et al. ............. 257/350 |
| 2005/0211989 A1* | 9/2005 | Horio et al. ..................... 257/79 |
| 2006/0081868 A1* | 4/2006 | Kotani ............................ 257/99 |
| 2009/0090923 A1* | 4/2009 | Murayama ...................... 257/97 |
| 2011/0068402 A1* | 3/2011 | Takasawa et al. ............. 257/347 |

FOREIGN PATENT DOCUMENTS

JP     11 150301      *   6/1999
JP     H11-150301 A       6/1999

* cited by examiner

*Primary Examiner* — Julio J Maldonado
*Assistant Examiner* — Jaehwan Oh
(74) *Attorney, Agent, or Firm* — Global IP Counselors, LLP

(57) ABSTRACT

A semiconductor element includes a semiconductor layer, an electrode, an adhesion layer, and an insulating layer. The electrode is disposed over the semiconductor layer and has a first upper surface and a second upper surface disposed further away from the semiconductor layer than the first upper surface. The adhesion layer is disposed on the first upper surface of the electrode so that the second upper surface of the electrode is disposed further away from the semiconductor layer than an upper surface of the adhesion layer. The insulating layer covers from the upper surface of the adhesion layer to the semiconductor layer.

12 Claims, 6 Drawing Sheets

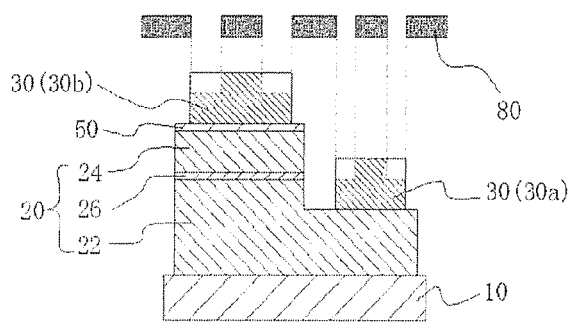
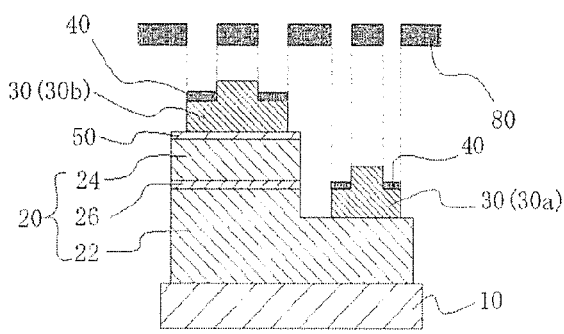
FIG. 5A          FIG. 5B
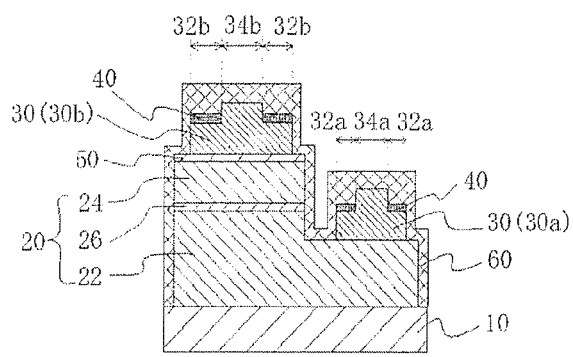
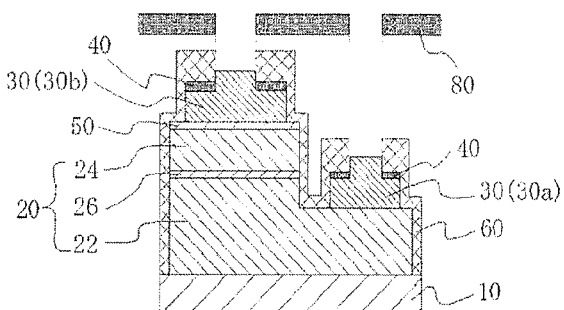
FIG. 5C          FIG. 5D

SEMICONDUCTOR ELEMENT AND METHOD OF MANUFACTURING THE SEMICONDUCTOR ELEMENT

CROSS-REFERENCE TO RELATED APPLICATIONS

This application claims priority to Japanese Patent Application No. 2010-147133 filed on Jun. 29, 2010. The entire disclosure of Japanese Patent Application No. 2010-147133 is hereby incorporated herein by reference.

BACKGROUND

1. Technical Field

The present invention relates to a semiconductor element, and particularly to an electrode structure of the semiconductor element.

2. Related Art

Conventionally, a semiconductor element may be covered with an insulating layer made of a transparent material such as SiO2, to protect its semiconductor layer from external environment. More specifically, as shown in FIG. 6, a metal layer 140 for improving adhesion with an insulating layer 160 is disposed on the periphery of the upper surface of an electrode 130 disposed on a semiconductor layer 120 formed over a substrate 110, and from the upper surface of the metal layer 140 to the semiconductor layer 120 is continuously covered with an insulating layer 160 (see JP H11-150301).

SUMMARY

However, at the time of mounting the semiconductor element to a semiconductor device, a bonding member made of a metal material such as Au is heated in a state being in contact with the metal layer, so that particularly in the case where high temperature eutectic bonding is used, the bonding member is easily diffused into the metal layer, which results in reduction in adhesion of the metal layer. As a result, the insulating layer is detached from the electrode which may allow entering of the bonding member from the detached portion, and in the worst case, resulting in disabling light emission of the semiconductor element.

Accordingly, the present invention is devised to solve the problems as described above, and is aimed to provide a semiconductor element capable of reducing diffusion of a bonding member used for mounting of the semiconductor element into a metal layer.

In order to achieve the above object and other objects of the present invention, A semiconductor element according to one aspect includes a semiconductor layer, an electrode, an adhesion layer, and an insulating layer. The electrode is disposed over the semiconductor layer and has a first upper surface and a second upper surface disposed further away from the semiconductor layer than the first upper surface. The adhesion layer is disposed on the first upper surface of the electrode so that the second upper surface of the electrode is disposed further away from the semiconductor layer than an upper surface of the adhesion layer. The insulating layer covers from the upper surface of the adhesion layer to the semiconductor layer. With this arrangement, the adhesion layer is disposed on the first upper surface of the electrode spaced apart from the second upper surface which will be in contact with the bonding member, so that diffusion of the bonding member into the adhesion layer can be reduced.

Further, the insulating layer preferably covers the electrode such that at least a part of the second upper surface of the electrode is not covered by the insulating layer. With this arrangement, the second upper surface of the electrode can be used as a main contact surface with the bonding member. Accordingly, the bonding member can be suppressed from diffusing into the electrode from the first upper surface, and further diffusing into the adjacent adhesion layer.

A portion of the electrode forming the second upper surface is preferably continuously made of the same member as a portion of the electrode forming the first upper surface. In other words, the two portions are integrally formed as a one-piece, unitary member. With this arrangement, even in the case where the bonding member diffuses into the electrode through the second upper surface, a portion of the electrode forming the second upper surface protruding further than the first upper surface can be prevented from detaching from a portion of the electrode forming the first upper surface.

Further, in top plan view, the first upper surface of the electrode preferably surrounds the second upper surface of the electrode. Thus, the insulating layer can be prevented from detaching from the electrode.

According to another aspect, a method of manufacturing a semiconductor element including a semiconductor layer, an electrode disposed on the semiconductor layer, an adhesion layer disposed on the electrode, and an insulating layer covering the adhesion layer and the semiconductor layer, includes: forming the electrode on the semiconductor layer so that the electrode has a first upper surface and a second upper surface disposed further away from the semiconductor layer than the first upper surface; and forming the adhesion layer and the insulating layer stacked in this order on the first upper surface of the electrode.

Further, the forming of the electrode on the semiconductor layer may include stacking a first portion of the electrode and stacking a second portion of the electrode on the first portion of the electrode, with the first upper surface being part of the first portion and the second upper surface being part of the second portion, and the forming of the adhesion layer and the insulating layer may include stacking the adhesion layer and the insulating layer in this order on an upper surface of the first portion of the electrode before the stacking of the second portion of the electrode on the first portion of the electrode, and partially removing the adhesion layer and the insulating layer to expose a part of the upper surface other than the first upper surface of the first portion of the electrode to define an opening above the part of the upper surface of the first portion of the electrode so that the second portion of the electrode is stacked on the part of the upper surface of the first portion of the electrode in the opening. With this arrangement, a step of partially removing the adhesion layer and the insulating layer and a step of further stacking the electrode can be performed sequentially, so that formation of the second upper surface protruding further than the first upper surface can be facilitated. Further, the first portion of the electrode and the second portion of the electrode are preferably made of the same material. This arrangement facilitates forming of the electrode having the first upper surface and the second upper surface protruding further than the first upper surface with the same continuous material.

Further, the forming of the electrode on the semiconductor layer may include stacking the electrode on the semiconductor layer and removing a peripheral portion of the electrode so that the electrode has the first upper surface and the second upper surface; and the forming of the adhesion layer and the insulating layer may include, after the removing of the peripheral portion of the electrode, forming the adhesion layer to cover the first upper surface of the electrode and forming the insulating layer to cover the adhesion layer and the semiconductor layer.

The semiconductor element and method of manufacturing the semiconductor element according to above aspects provide a semiconductor element capable of reducing diffusion of a bonding member used for mounting of the semiconductor element into an adhesion layer.

BRIEF DESCRIPTION OF THE DRAWINGS

Referring now to the attached drawings which form a part of this original disclosure:

FIGS. 5A through 5D are cross sectional views schematically showing another method of manufacturing a semiconductor element according to the first embodiment of the present invention.

DETAILED DESCRIPTION OF EXEMPLARY EMBODIMENTS

Figure 1:
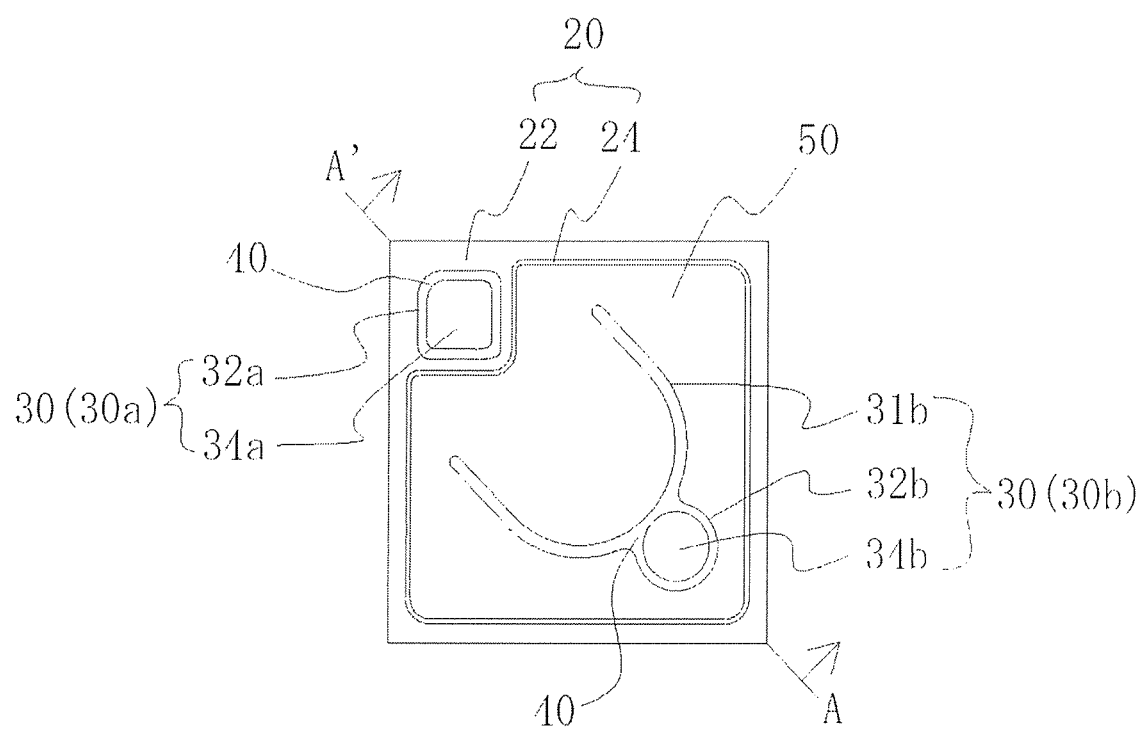
FIG. 1 is a plan view schematically showing a semiconductor element according to the first embodiment of the present invention.

Hereinafter, embodiments of a semiconductor element and a method of manufacturing the semiconductor element according to the present invention will be described in detail with reference to figures. The sizes and the arrangement relationships of the members in each of drawings may be shown exaggerated for ease of explanation. In the description below, the same designations or the same reference numerals denote the same or like members and duplicative descriptions will be appropriately omitted.

First Embodiment

Figure 2:
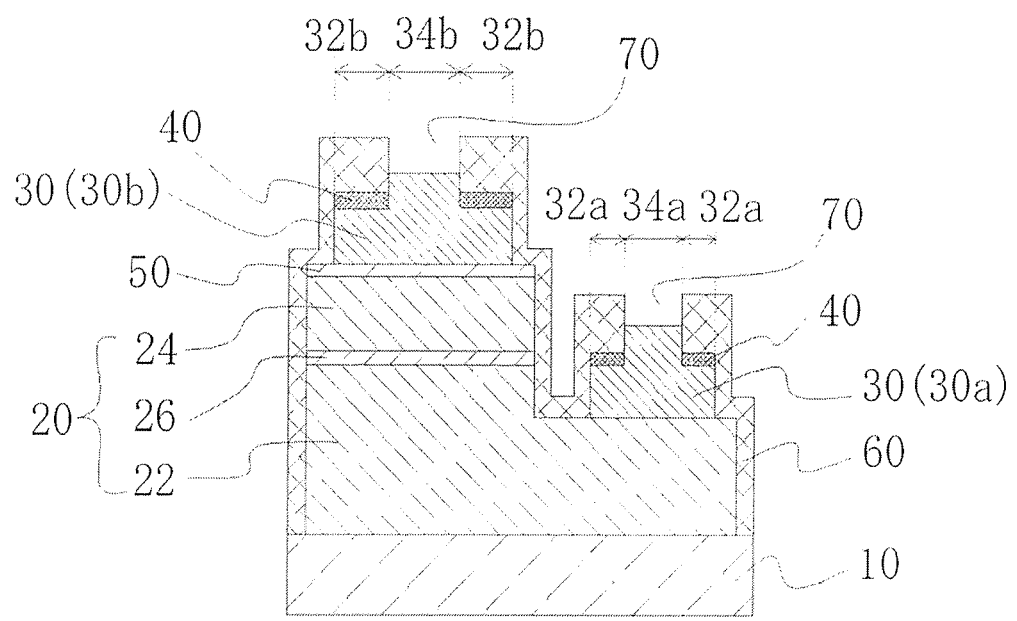
FIG. 2 is a cross sectional view schematically showing a cross sectional view of a semiconductor element according to the first embodiment of the present invention taken along line A-A' of FIG. 1.

FIG. 1 is a plan view schematically showing a semiconductor element according to the first embodiment. FIG. 2 is a cross sectional view schematically showing a cross sectional view of a semiconductor element according to the first embodiment taken along line A-A' of FIG. 1. FIGS. 4A through 4F are cross sectional views schematically showing a method of manufacturing a semiconductor element according to the first embodiment. FIGS. 5A through 5D are cross sectional views schematically showing another method of manufacturing a semiconductor element according to the first embodiment.

As shown in FIG. 1 and FIG. 2, the semiconductor element according to the first embodiment includes at least a substrate 10, a semiconductor layer 20 disposed on the substrate 10, an electrode 30 (30a, 30b) disposed on the semiconductor layer 20 and having a first upper surface 32a, 32b and a second upper surface 34a, 34b protruding further than the first upper surface 32a, 32b (i.e., the second upper surface 34a, 34b is disposed further away from the semiconductor layer 20 than the first upper surface 32a, 32b), and an adhesion layer 40 disposed on the first upper surface 32a, 32b of the electrode 30 and having an upper surface located in the semiconductor layer side 20 than the second upper surface 34a, 34b of the electrode 30 (i.e., the second upper surface 34a, 34b is disposed further away from the semiconductor layer 20 than the upper surface of the adhesion layer 40), and an insulating layer 60 covering from the upper surface of the adhesion layer 40 to the semiconductor layer 20. In the present specification, the term "upper" means a side in which the electrode 30 is stacked with respect to the semiconductor layer 20, which is an upper direction in FIG. 2.

More specifically, the semiconductor element of the present embodiment is a light emitting element, in which on the substrate 10, an n-type semiconductor layer 22, an active layer 26, and a p-type semiconductor layer 24 are stacked in this order as the semiconductor layer 20. Further, a pair of electrodes 30a, 30b are disposed at the upper surface side of the semiconductor element, where an n-side electrode 30a is electrically connected to the n-type semiconductor layer 22 and a p-side electrode 30b is electrically connected to the p-type semiconductor layer 24. In this case, the n-side electrode 30a is disposed on the surface of the n-type semiconductor layer 22 which is exposed by removing a part of the p-type semiconductor layer 24 and the active layer 26. On the other hand, the p-side electrode 30b is disposed on and in contact with a transparent electrode 50 which is formed on the approximately entire surface of the p-type semiconductor layer 24. Both of the n-side electrode 30a and the p-side electrode 30b respectively have the first upper surface 32a, 32b and the second upper surface 34a, 34b protruding further than the first upper surface 32a, 32b, where in the top plan view, the first upper surface 32a, 32b is disposed to surround the periphery of the second upper surface 34a, 34b. Further, a part of the first upper surface 32b in the p-side electrode 30b is connected to an extending portion 31b of the p-side electrode 30b, which extends toward the n-side electrode 30a and is capable of uniformly supplying electric current to the transparent electrode 50. The adhesion layer 40 is disposed on the first upper surface 32a, 32b of each electrode and the second upper surface 34a, 34b protrudes further then the upper surface of the adhesion layer 40. Thus, the adhesion layer 40 is disposed on the first upper surface 32a, 32b and is spaced apart from the second upper surface 34a, 34b. Further, the insulating layer 60 is disposed on the upper surface of the adhesion layer 40, and is continuously disposed from the upper surface of the adhesion layer 40 to the semiconductor layer 20. The surrounding of the second upper surface 34a, 34b is covered with the insulating layer 60 so that the second upper surface 34a, 34b is exposed, and the bonding member (not shown) used at the time of mounting the semiconductor element is not directly in contact with the first upper surface 32a, 32b. With this arrangement, the bonding member diffused from the second upper surface 34a, 34b into the electrode 30 can be prevented from diffusing in the adhesion layer 40 which is adjacent to the electrode 30. Further, the second upper surface 34a, 34b are arranged lower than the upper surface of the insulating layer 60 disposed on the adhesion layer 40. That is, the second upper surface 34a, 34b forms the bottom surface of the opening 70 formed in the insulating layer 60, which enables to supply sufficient amount of the bonding member in the opening 70, and thus the bonding strength can be enhanced. Each electrode 30a, 30b is formed by the same member, continuously at least from the second upper surface 34a, 34b to the first upper surface 32a, 32b. With this arrangement, even in the case where the bonding member diffuses into the electrode through the second upper surface 34a, 34b, a part of the electrode at the second upper surface side protruding further than the first upper surface can be prevented from detaching from the rest of the electrode. The adhesion layer 40 is, as shown in FIGS. 1 and 2, preferably disposed on the entire surface of the first upper surface 32a, 32b of each electrode, but may be disposed on a part of the first upper surface 32a, 32b of each electrode as long as the adhesion layer 40 is in contact with a portion of each electrode which is protruding further than the first upper surface 32a, 32b towards the second upper surface 34a, 34b.

The semiconductor element according to the first embodiment having a structure described above is capable of reducing diffusion of the bonding member used at the time of mounting into the adhesion layer 40.

Each component of the embodiments of the present invention will be described in detail below.

Substrate

For the substrate, a member capable of epitaxially growing a nitride semiconductor is sufficient and the size and/or the thickness of the member is not specifically limited. Examples of the material for the substrate include an insulating substrate such as sapphire ($Al_2O_3$) and spinel ($MgAl_2O_4$), silicone carbide (SiC), ZnS, ZnO, Si, GaAs, diamond, and an oxide substrate such as lithium niobate and neodymium gallate which are capable of forming a lattice junction with the nitride semiconductor.

Semiconductor Layer

The semiconductor layer includes at least an n-type semiconductor layer, an active layer, and a p-type semiconductor layer, and the kind and a material are not specifically limited, but for example, a gallium nitride-based semiconductor material such as $In_XAl_YGa_{1-X-Y}N$ ($0 \leq X$, $0 \leq Y$, $X+Y \leq 1$) is preferably used.

Electrode

The electrode is a member to which a bonding member such as a solder, which is used at the time of mounting the semiconductor element, is connected to supply electric current to the semiconductor layer from outside. An n-side electrode is electrically connected to the n-type semiconductor layer and a p-side electrode is electrically connected to the p-type semiconductor layer, respectively. Examples of the material of the electrode include a metal material such as Ag, Al, Pt, Au, Ni, Ti, Cr, W, Rh, Ru, Ir, Hf, Mo, or Ta, and particularly, the material preferably contains at least one selected from the group consisting of Pt, Rh, Ir, and Ru, which is capable of reducing the diffusion of the bonding member whose main component is Au. For example, the electrode may be formed with a stacked layer of such metal materials, and the metal material such as Pt, Rh, Ir, or Ru is preferably mainly used as a layer at the upper surface side which is in contact with the bonding member. Meanwhile, the metal material such as Ti, Ni, Cr, W, Mo, or Ta having excellent adhesion with the semiconductor layer and the transparent electrode, or the metal material such as Ag, Al, Pt, or Rh capable of efficiently reflecting the light from the semiconductor layer is preferably used as a layer at the side contacting the transparent electrode which is to be described later. More specifically, the metal materials are stacked in sequence from the semiconductor layer side, such as Ti/Pt or Ti/Rh/Pt, Cr/Rh/Pt, or Ag/Ti/Pt, and the outer most layer of Pt layer may be formed with a protruded shape having the first upper surface and the second upper surface. With this arrangement, the Pt layer which is capable of reducing the diffusion of the bonding member into the electrode and the adhesion layer and the other layers (Ti layer, Cr layer, Rh layer, and/or Ag layer) can serve different purposes, so that the most suitable metal material can be selected according to the needs. In addition, in order to enhance the adhesion with the bonding member, a bonding layer made of a material contained in the bonding member may be further stacked on the second upper surface of the electrode. For example, in the case where AuSn is used as the material of the bonding member, Au is preferably used as the material of the bonding layer.

Transparent Electrode

The transparent electrode is a member disposed on approximately the entire surface of the upper surface of the p-type semiconductor layer, and is used to uniformly apply the electric current supplied from the p-side electrode to the entire surface of the p-type semiconductor layer. The transparent electrode is disposed at the light extracting side of the semiconductor element, so that an electrically conductive oxide is preferably employed as the material. A thin metal film may be used as the transparent electrode, but an electrically conductive oxide has higher light transmissive property with respect to that of the thin metal film, so that the light emitting efficiency of the semiconductor element can be improved by employing the electrically conductive oxide. Examples of the electrically conductive oxide include an oxide containing at least one selected from the group consisting of Zn, In, Sn, and Mg, and more specifically, ZnO, $In_2O_3$, $SnO_2$, ITO, and the like can be exemplified. In particular, ITO is a material which exhibits high light transmissive property in visible light (visible region) and has relatively high electric conductivity, so that it is preferably used.

Adhesion Layer

The adhesion layer is a member for improving the adhesion between the insulating layer and the electrode so that the insulating layer is prevented from detaching from the electrode. The material for such adhesion layer is sufficient to have excellent adhesion with the insulating layer and the electrode. It is particularly preferable that the adhesion layer is a metal layer made of a material containing at least one selected from Ti, Ni, Cr, W, Mo, and Ta. An oxide of Ti, Ni, Cr, W, Mo, Ta, or the like may be used also for the adhesion layer. With this, excellent adhesion between the insulating layer and the electrode can be obtained and diffusion of the bonding member in the adhesion layer can be reduced.

Insulating Layer

The insulating layer is a member for mainly protecting the semiconductor layer from the external environment, and covers the entire upper surface of the semiconductor element except for the second upper surface to where the bonding member is going to be contacted. Examples of the material of the insulating layer include an oxide of Si, Ti, Ta, Zr, or the like, having light transmissive property, for example, $SiO_2$ and $ZrO_2$.

Method Of Manufacturing Semiconductor Element

Referring to FIGS. 4A through 4F, one example of a method of manufacturing a semiconductor element will be described below. FIGS. 4A through 4F are cross sectional views schematically showing a method of manufacturing a semiconductor element according to the first embodiment. The structure of the semiconductor element according to the first embodiment has been described above and the explanation thereof will be omitted.

Figure 4A:
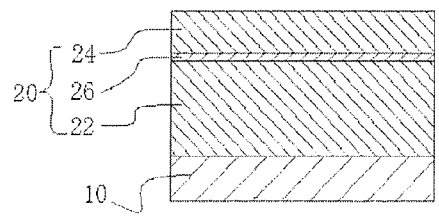
FIGS. 4A through 4F are cross sectional views schematically showing a method of manufacturing a semiconductor element according to the first embodiment of the present invention.
Figure 4B:
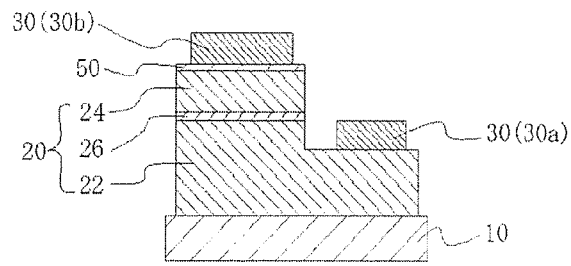
Figure 4C:
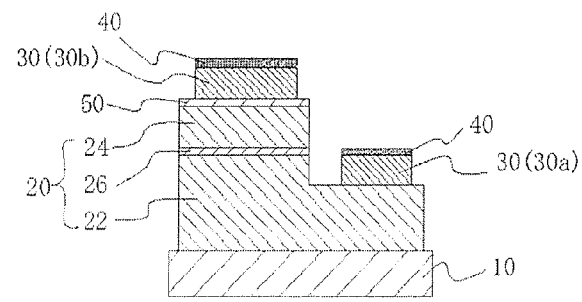
Figure 4D:
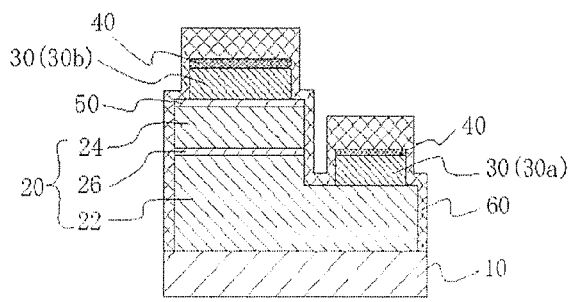
Figure 4E:
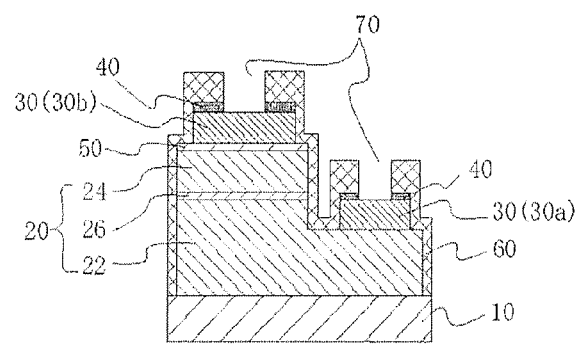
Figure 4F:
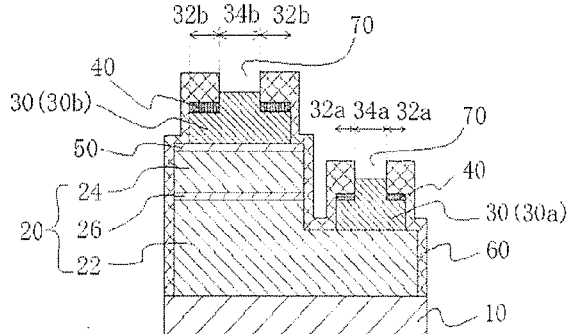
Figure 6:
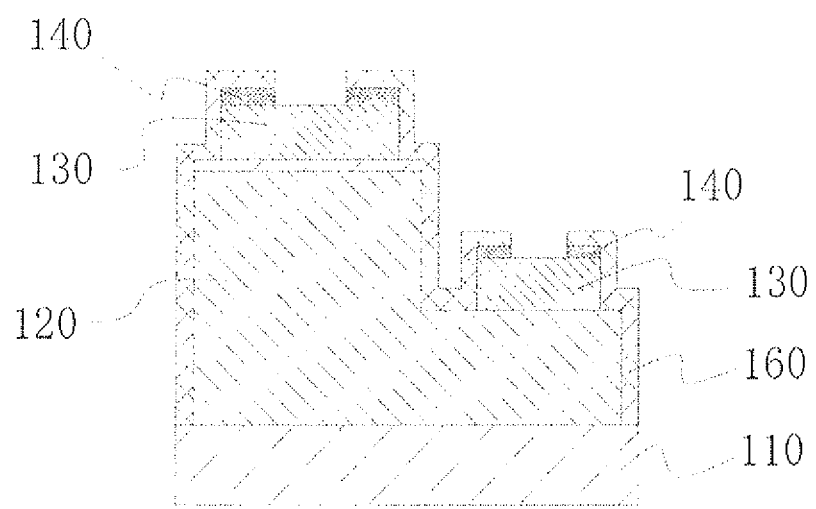
FIG. 6 is a cross sectional view schematically showing a conventional semiconductor element.

A method of manufacturing a semiconductor element according to one aspect of the present invention includes at least a first step (see FIG. 4A) of stacking the semiconductor layer 20 on the substrate 10, a second step (see FIG. 4B) of stacking the electrode 30 (30a, 30b) on the semiconductor layer 20, a third step (see FIG. 4C) of stacking the adhesion layer 40 on the upper surface of the electrode 30, a fourth step (see FIG. 4D) of stacking the insulating layer 60 to continuously cover the semiconductor layer 20, the electrode 30, and the adhesion layer 40, and a fifth step of removing a part of the adhesion layer 40 and the insulating layer 60 stacked in this sequence on the upper surface of the electrode 30 to partially expose the upper surface of the electrode 30 and to define an opening 70 (see FIG. 4E) and further stacking the electrode in the opening 70 which is formed by the removal (see FIG. 4F). With this method, partially removing the adhesion layer 40 and the insulating layer 60 through further stacking the electrode 30 can be performed in one continuous step, so that formation of the electrode 30 having the second upper surface 34a, 34b protruding further than the first top surface 32a, 32b can be facilitated. At this time, the electrode to be exposed and the electrode to be stacked in the opening are preferably made of the same material, and the formation of the electrode 30 of the semiconductor element having the first upper surface 32a, 32b and the second upper surface 34a, 34b protruding further than the first upper surface 32a, 32b can be facilitated by using the same, continuous material.

First Step

In the first step, the semiconductor layer 20 made of an n-type semiconductor layer 22, a light emitting layer 26, and a p-type semiconductor layer 24 is stacked on the substrate 10. More specifically, on a foreign substrate made of washed sapphire or the like, with supplying a gas containing predetermined semiconductor materials, a dopant, or the like, and using an vapor deposition apparatus of such as MOVPE (Metal Organic Vapor Phase Epitaxy), HVPE (Hydride Vapor Phase Epitaxy), MBE (Molecular Beam Epitaxy), or MOMBE (Metal Organic Molecular Beam Epitaxy), an n-type semiconductor layer 22, a light emitting layer 26, and a p-type semiconductor layer 24 are stacked in this sequence by way of vapor deposition.

Second Step

In the second step, the n-side electrode 30a is stacked on the n-type semiconductor layer 22, the p-side electrode 30b is stacked over the p-type semiconductor layer 24, respectively. In the second step, firstly, a resist mask (not shown) having a predetermined shape is disposed on the p-type semiconductor layer 24 which is a component of the semiconductor layer 20. Following this, using an RIE (Reactive Ion Etching) apparatus, etching is performed over the mask until the surface of the n-type semiconductor layer 22 is exposed, and then the resist is removed. Next, using a sputtering machine, ITO is deposited on the semiconductor layer 20. Following this, a resist mask (not shown) is formed so that the ITO film will remain on the substantially entire surface of the p-type semiconductor layer 24 and etching is carried out, then the resist is removed. Next, annealing is carried out to improve the ohmic contact property of the ITO film to obtain the transparent electrode 50. Next, a resist mask (not shown) is formed except on the predetermined regions of the exposed n-type semiconductor layer 22 and the transparent electrode 50, respectively. A metal material such as Ti, Pt which forms the electrode 30 is deposited over the mask by using a sputtering machine. At this time, disposing a plurality of metal materials in a continuous manner facilitates formation of the electrode made of a plurality of layers (for example Ti/Pt etc.).

Third Step

In the third step, an adhesion layer 40 for improving the adhesion with the insulating layer 60 which to be described later is stacked on the upper surface of the stacked electrode 30. In the third step, using the sputtering machine, a metal material such as Ni which forms the adhesion layer 40 is deposited over the mask which is used at the time of stacking the electrode in the second step. Then, together with the metal material (Ti, Pt, Ni, etc.) deposited on the resist, the resist is removed. With this, a state is obtained in which the n-side electrode 30a and the p-side electrode 30b are stacked in the predetermined regions and the adhesion layer 40 is stacked on each electrode 30 with the same shape in plan view.

Fourth Step

In the fourth step, an insulating layer 60 is stacked to cover entire surface of the semiconductor element. In the fourth step, using the sputtering machine, a $SiO_2$ film is deposited as the insulating layer 60 over the semiconductor element.

Fifth Step

In the fifth step, the electrode 30 having the second upper surface 34a, 34b is stacked so as to protrude from the first upper surface 32a, 32b. In the fifth step, first, the resist mask (not shown) is formed except on the predetermined region of the adhesion layer 40, and etching is carried out on the insulating layer 60 and the adhesion layer 40 to expose the upper surface of the electrode 30. Following this, using the same mask, the same metal material as the exposed electrode 30 is deposited in the opening 70 formed by the etching by using the sputtering machine, and then the resist is removed. With this, removing of the insulating layer 60 and the adhesion layer 40 through further stacking the electrode can be performed in a continuous step, thus the manufacturing steps can be simplified.

In the method of manufacturing the semiconductor element according to the present invention, for the sake of simplicity, a single semiconductor element is shown and described, but the method can be applied in the same manner to a wafer state (before dividing into individual semiconductor elements). For example, in the fourth step, in the wafer state, etching is carried out on the semiconductor layer 20 at each part corresponding to a single semiconductor element along each planned dicing line for dividing into individual semiconductor elements to expose the substrate 10, then stack the insulating layer 60. With this, as in the case using a single semiconductor element, the insulating layer 60 can be applied to cover to the side surfaces of the semiconductor layer 20. Also, not to be limited to that described above, the wafer may be divided into individual semiconductor elements after stacking the insulating layer 60 (for example, after the fifth step). In this case, the side surfaces of the semiconductor layer are exposed from the insulating layer 60, but the bonding member will not reach to the side surfaces of the semiconductor layer, so that the cost of the material can be reduced and thus preferable.

Alternative Method of Manufacturing Semiconductor Element

As shown in FIGS. 5A through 5D, a method other than the third step through fifth step described above may be employed also. FIGS. 5A through 5D are cross sectional views schematically showing another method of manufacturing a semiconductor element according to the first embodiment.

In this alternative method, after the second step shown in FIG. 4B, a resist mask 80 is formed except on the regions corresponding to the peripheral regions of the upper surface of the electrode 30, and using an RIE machine, an etching is carried out over the mask 80 to remove the peripheral regions of the upper surface of the electrode 30. Following this, using the sputtering machine, a metal material such as Ni which formed the adhesion layer 40 is deposited, and then the resist 80 is removed (see FIG. 5B). With this, the electrode 30 having the first upper surface 32a, 32b and the second upper surface 34a, 34b protruding further than the first upper surface 32a, 32b can be formed, and further, a state in which the adhesion layer 40 is stacked on the first upper surface 32a, 32b of the electrode 30 can be obtained. Next, using the sputtering machine, depositing a SiO$_2$ film as the insulating layer 60 over the semiconductor element, thus the insulating layer 60 is stacked to cover the entire surface over the semiconductor element (see FIG. 5C). Finally, a resist mask 80 is formed except on the regions corresponding with the second upper surface 34a, 34b of the electrode 30, and using an RIE machine, an etching is carried out over the resist mask 80 to remove the insulating layer 60 so as to expose the second upper surface 34a, 34b of the electrode 30 (see FIG. 5D). Thereafter, the resist 80 is removed.

Second Embodiment

Figure 3:
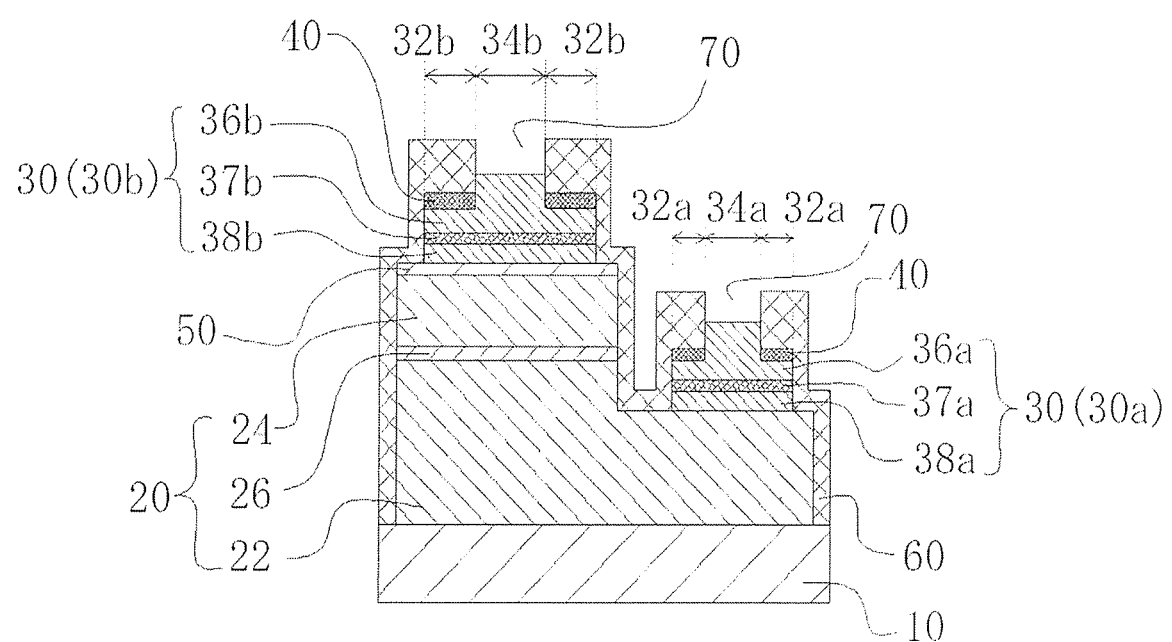
FIG. 3 is a cross sectional view schematically showing a semiconductor element according to the second embodiment of the present invention.

FIG. 3 is a cross sectional view schematically showing a semiconductor element according to the second embodiment of the present invention.

The semiconductor element according to the second embodiment has a structure substantially the same as that according to the first embodiment, except that the electrode 30 has a multilayer structure including a diffusion-reducing layer 37a, 37b. The description on the same structure as above may be omitted. The semiconductor element according to the present embodiment has at least a substrate 10, a semiconductor layer 20, an electrode 30, an adhesion layer 40, and an insulating layer 60. The electrode 30 is disposed on the upper surface of the semiconductor layer 20 disposed on the substrate 10. The electrode 30 has a first upper surface 32a, 32b and a second upper surface 34a, 34b protruding further than the first upper surface 32a, 32b. The adhesion layer 40 is stacked on the first upper surface 32a, 32b of the electrode, and the insulating layer 60 is further stacked on the upper surface of the adhesion layer 40. The insulating layer 60 is disposed to surround the periphery of the electrode so that the second upper surface 34a, 34b of the electrode is exposed, and to cover continuously from the upper surface of the adhesion layer 40 to the semiconductor layer 20. With this arrangement, as in the case of the first embodiment, diffusion of the bonding member, which is used at the time of mounting, into the adhesion layer 40 can be reduced. Further, the electrode 30 is formed of a plurality of layers, more specifically, a diffusion reducing layer 37a, 37b and a layer 36a, 36b having a protrusion and having a first upper surface and a second upper surface are stacked in this order from the semiconductor layer 20 side. With this structure, even in the case where the bonding member is diffused into the electrode from the second upper surface 34a, 34b, due to the diffusion reducing layer 37a, 37b located beneath electrode, the diffusion of the bonding member can be prevented from reaching the contact surface of the electrode and the semiconductor layer 20 or the transparent electrode 50. Accordingly, diminishing of the ohmic contact property between the electrode 30 and the semiconductor layer 20 or the transparent electrode 50 and detachment of the electrode 30 from the semiconductor layer 20 or the transparent electrode 50 can be prevented.

Moreover, the electrode 30 according to the present embodiment may have a light reflecting layer 38a, 38b further stacked between the diffusion reducing layer 37a, 37b and the semiconductor layer 20 or the transparent electrode 50. For such a light reflecting layer 38a, 38b, a metal material such as Ag, Al, Pt, Rh capable of efficiently reflecting light from the semiconductor layer 20 can be used. In addition, in order to enhance the adhesion with the bonding member, a bonding layer (not shown) made of a material contained in the bonding member may be further stacked on the second upper surface 34a, 34b of the electrode 30. For example, in the case where AuSn is used as the material of the bonding member, Au is preferably used as the material of the bonding layer.

Diffusion-Reducing Layer

The diffusion reducing layer is one of the layers constructing the electrode and is the member for reducing the diffusion of the bonding member, which is used at the time of mounting the semiconductor element, inside the electrode. The diffusion reducing layer according to the present embodiment is stacked closer to the semiconductor layer than the protruding layer having the first upper surface and the second upper surface, but it is not limited thereto, for example, the diffusion reducing layer may be stacked closer to the upper surface than the protruding layer. Examples of the material for such a diffusion reducing layer include at least one metal material selected from Ti, Ni, Cr, W, Mo, Ta, and the like.

The semiconductor element according to the illustrated embodiment can be used for general lighting and for various light sources such as backlight of car navigation monitors, head lamp for automobiles, signals, and large screen displays.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Other Embodiment (A) In the above embodiments, the adhesion layer 40 is disposed on both the first upper surface 32a of the n-side electrode 30a and the first upper surface 32b of the p-side electrode 30b, but the arrangement is not limited to this. The adhesion layer 40 may be disposed on one of the first upper surface 32a and the first upper surface 32b.

(B) In the above embodiments, the second upper surface 34a, 34b is located in the semiconductor layer 20 side than the upper surface of the insulating layer 60 (i.e., the upper surface of the insulating layer 60 is disposed further away from the semiconductor layer 20 than the second upper surface 34a, 34b), but the arrangement is not limited to this. The upper surface of the insulating layer 60 may be located in the semiconductor layer 20 side than the second upper surface 34a, 34b (i.e., the second upper surface 34a, 34b may be disposed further away from the semiconductor layer 20 than the upper surface of the insulating layer 60). Furthermore, the upper surface of the insulating layer 60 may be arranged to be flush with the second upper surface 34a, 34b.

What is claimed is:

1. A semiconductor element comprising:
a semiconductor layer;
an electrode disposed over the semiconductor layer and having a first upper surface and a second upper surface disposed further away than the first upper surface from the semiconductor layer;
an adhesion layer disposed on the first upper surface of the electrode so that the second upper surface of the electrode is disposed further away from the semiconductor layer than an upper surface of an end portion of the adhesion layer facing a side of the electrode, the end portion of the adhesion layer being spaced apart from the second upper surface of the electrode; and
an insulating layer covering from the upper surface of the adhesion layer to the semiconductor layer.

2. The semiconductor element according to claim 1, wherein
the insulating layer covers the electrode such that at least a part of the second upper surface of the electrode is not covered by the insulating layer.

3. The semiconductor element according to claim 1, wherein
a portion of the electrode forming the second upper surface is continuously made of the same member as a portion of the electrode forming the first upper surface.

4. The semiconductor element according to claim 1, wherein
in top plan view, the first upper surface of the electrode surrounds the second upper surface of the electrode.

5. The semiconductor element according to claim 1, wherein
the insulating layer and the electrode collectively cover an entire outer surface of the adhesion layer.

6. The semiconductor element according to claim 1, further comprising
a transparent electrode disposed between the semiconductor layer and the electrode.

7. A method of manufacturing a semiconductor element including a semiconductor layer, an electrode disposed on the semiconductor layer, an adhesion layer disposed on the electrode, and an insulating layer covering the adhesion layer and the semiconductor layer, the method comprising:
forming the electrode on the semiconductor layer so that the electrode has a first upper surface and a second upper surface disposed further away from the semiconductor layer than the first upper surface; and
forming the adhesion layer and the insulating layer stacked in this order on the first upper surface of the electrode so that the second upper surface of the electrode is disposed further away from the semiconductor layer than an upper surface of an end portion of the adhesion layer facing a side of the electrode, with the end portion of the adhesion layer being spaced apart from the second upper surface of the electrode.

8. The method of manufacturing the semiconductor element according to claim 7, wherein
the forming of the electrode on the semiconductor layer includes stacking a first portion of the electrode and stacking a second portion of the electrode on the first portion of the electrode, with the first upper surface being part of the first portion and the second upper surface being part of the second portion, and
the forming of the adhesion layer and the insulating layer includes stacking the adhesion layer and the insulating layer in this order on an upper surface of the first portion of the electrode before the stacking of the second portion of the electrode on the first portion of the electrode, and partially removing the adhesion layer and the insulating layer to expose a part of the upper surface other than the first upper surface of the first portion of the electrode to define an opening above the part of the upper surface of the first portion of the electrode so that the second portion of the electrode is stacked on the part of the upper surface of the first portion of the electrode in the opening.

9. The method of manufacturing the semiconductor element according to claim 8, wherein
the first portion of the electrode and the second portion of the electrode are made of the same material.

10. The method of manufacturing the semiconductor element according to claim 7, wherein
the forming of the electrode on the semiconductor layer includes stacking the electrode on the semiconductor layer and removing a peripheral portion of the electrode so that the electrode has the first upper surface and the second upper surface; and
the forming of the adhesion layer and the insulating layer includes, after the removing of the peripheral portion of the electrode, forming the adhesion layer to cover the first upper surface of the electrode and forming the insulating layer to cover the adhesion layer and the semiconductor layer.

11. A semiconductor element comprising:
a semiconductor layer;
an electrode disposed over the semiconductor layer and having a first upper surface and a second upper surface disposed further away than the first upper surface from the semiconductor layer;
an adhesion layer disposed on the first upper surface of the electrode so that the second upper surface of the electrode is disposed further away from the semiconductor layer than an upper surface of the adhesion layer; and
an insulating layer covering from the upper surface of the adhesion layer to the semiconductor layer,
the insulating layer and the electrode collectively covering an entire outer surface of the adhesion layer.

12. The semiconductor element according to claim 11, further comprising
a transparent electrode disposed between the semiconductor layer and the electrode.

* * * * *